(12) United States Patent
Wang et al.

(10) Patent No.: US 12,699,143 B2
(45) Date of Patent: Aug. 4, 2026

(54) ENERGY STORAGE SYSTEM AND MONITORING APPARATUS FOR SAME

(71) Applicant: XIAMEN DONESTY ECOMMERCE CO., LTD., Xiamen (CN)

(72) Inventors: Hao Wang, Xiamen (CN); Haojun Hong, Xiamen (CN); Chenxin Hong, Xiamen (CN)

(73) Assignee: XIAMEN DONESTY ECOMMERCE CO., LTD., Fujian (CN)

( * ) Notice: Subject to any disclaimer, the term of this patent is extended or adjusted under 35 U.S.C. 154(b) by 209 days.

(21) Appl. No.: 18/645,401

(22) Filed: Apr. 25, 2024

(65) Prior Publication Data

US 2025/0208220 A1 Jun. 26, 2025

(30) Foreign Application Priority Data

Dec. 25, 2023 (CN) .......................... 202323549064.0

(51) Int. Cl.
| | |
|---|---|
| *G01R 31/392* | (2019.01) |
| *G01R 31/371* | (2019.01) |
| *G01R 31/3842* | (2019.01) |
| *H02J 3/007* | (2026.01) |
| *H02J 3/02* | (2006.01) |
| *H02J 3/32* | (2006.01) |
| *H02J 3/38* | (2006.01) |
| *H02J 7/35* | (2006.01) |
(Continued)

(52) U.S. Cl.
CPC ....... *G01R 31/3842* (2019.01); *G01R 31/371* (2019.01); *G01R 31/392* (2019.01); *H02J 3/007* (2020.01); *H02J 3/02* (2013.01); *H02J 3/32* (2013.01); *H02J 3/38* (2013.01); *H02J*

*7/35* (2013.01); *H02J 7/80* (2026.01); *H02S 10/20* (2014.12); *H02J 2101/24* (2026.01); *H02J 2207/20* (2020.01)

(58) Field of Classification Search
CPC ............. G01R 31/3842; G01R 31/371; G01R 31/392; H02J 3/007; H02J 3/02; H02J 3/32; H02J 3/38
See application file for complete search history.

(56) References Cited

U.S. PATENT DOCUMENTS

| | | | | |
|---|---|---|---|---|
| 9,780,602 | B2 * | 10/2017 | Tuerk | H02J 1/08 |
| 2017/0108233 | A1 * | 4/2017 | Howard | F24S 10/742 |
(Continued)

*Primary Examiner* — Dominic E Hawkins

(57) ABSTRACT

The present disclosure discloses an energy storage system and a monitoring apparatus for the energy storage system. The monitoring apparatus for the energy storage system includes: a plurality of monitors, each monitor being configured to sample an input electrical signal and/or an output electrical signal of one energy storage device and determine an operating parameter of the corresponding energy storage device based on the input electrical signal and/or the output electrical signal, and each monitor supporting a wireless networking mode; and a display terminal configured to perform a wireless communication with an upper computer, and transmit the operating parameter of the corresponding energy storage device to the upper computer by performing a wireless communication with each monitor when each the monitor operates in the wireless networking mode, to allow the upper computer to display the operating parameter of the corresponding energy storage device.

16 Claims, 5 Drawing Sheets

(51) Int. Cl.
  *H02J 7/80*        (2026.01)
  *H02S 10/20*       (2014.01)
  *H02J 101/24*          (2026.01)

(56)                References Cited

U.S. PATENT DOCUMENTS

| | | | | |
|---|---|---|---|---|
| 2019/0033397 | A1* | 1/2019 | Karner | G01R 31/392 |
| 2020/0403415 | A1* | 12/2020 | Inoue | G01R 31/367 |
| 2021/0157288 | A1* | 5/2021 | Rischar | G05B 19/41865 |
| 2021/0255249 | A1* | 8/2021 | Nakai | G01R 31/3842 |
| 2023/0113916 | A1* | 4/2023 | Park | H02J 7/60 |
| 2023/0216327 | A1* | 7/2023 | Aubin | H02J 7/80 |
| | | | | 320/162 |
| 2023/0407165 | A1* | 12/2023 | Matsushima | E21B 43/267 |

* cited by examiner

ENERGY STORAGE SYSTEM AND MONITORING APPARATUS FOR SAME

CROSS-REFERENCE TO RELATED APPLICATIONS

This application is based on and claims priority to Chinese Patent Application No. 202323549064.0 filed on Dec. 25, 2023, the entire disclosure of which is incorporated herein by reference.

TECHNICAL FIELD

The present disclosure relates to the field of energy storage device technologies, and more particularly, to an energy storage system and a monitoring apparatus for the energy storage system.

BACKGROUND

With the promotion of the Internet of Things, users have an increasingly high demand for the device communication function, and the traditional devices with their display function can no longer fully meet the needs of users for information acquisition.

Although the energy storage device in the related art has a communication function, for the entire energy storage system, the information of all devices in the system is not integrated. As an example, for current solar application-related products, such as inverters, controllers, lithium batteries, and other devices, users may use different devices of the same brand (e.g., inverter, controller, and lithium battery are of the same brand), or they may choose different devices of different brands (e.g., inverter, controller and lithium battery are of different brands). Different manufacturers of different brands have different mobile phone applications, and even different devices of the same brand may need to be viewed through different mobile phone applications. Therefore, users need to switch between several applications, which is both time-consuming and inefficient.

SUMMARY

The present disclosure aims to solve one of the technical problems in the related art at least to some extent. To this end, the first purpose of the present disclosure is to provide a monitoring apparatus for an energy storage system. Each monitor is configured to sample an input electrical signal and/or an output electrical signal of an energy storage device, and obtain an operating parameter of the energy storage device based on the input electrical signal and/or the output electrical signal of the energy storage device. Therefore, the monitor can obtain the operating parameter of the corresponding energy storage device of any brand. The monitor is further configured to transmit the operating parameter of the energy storage device to an upper computer through a display terminal, realizing the data integration of a plurality of energy storage devices. In this way, users do not have to switch application programs frequently, thereby saving their time.

The second purpose of the present disclosure is to provide an energy storage system.

To this end, a monitoring apparatus for an energy storage system is provided according to embodiments in a first aspect of the present disclosure. The monitoring apparatus includes: a plurality of monitors, each of the plurality of monitors being configured to sample an input electrical signal and/or an output electrical signal of one energy storage device and determine an operating parameter of the corresponding energy storage device based on the input electrical signal and/or the output electrical signal, and each of the plurality of monitors supporting a wireless networking mode; and a display terminal configured to perform a wireless communication with an upper computer, and transmit the operating parameter of the corresponding energy storage device to the upper computer by performing a wireless communication with each of the plurality of monitors when each of the plurality of monitors operates in the wireless networking mode, to allow the upper computer to display the operating parameter of the corresponding energy storage device.

According to the monitoring apparatus for the energy storage system of the embodiments of the present disclosure, each monitor is configured to sample the input electrical signal and/or the output electrical signal of the energy storage device, and obtain the operating parameter of the energy storage device based on the input electrical signal and/or the output electrical signal of the energy storage device. Since each monitor obtains the operating parameter of the energy storage device based on the input electrical signal and/or the output electrical signal of the energy storage device, the monitor does not depend on an operating parameter collected or saved by the energy storage device itself. Therefore, the monitor can obtain the operating parameter of the corresponding energy storage device of any brand. In addition, the monitor supports the wireless networking mode. The monitor is in wireless communication with the display terminal, and transmits the operating parameter of the energy storage device to the upper computer through the display terminal, thus realizing the data integration of the plurality of energy storage devices. In this way, users do not have to switch application programs frequently, thereby saving their time.

According to an embodiment of the present disclosure, each of the plurality of monitors is further configured to perform a wireless communication with the upper computer to transmit the operating parameter of the corresponding energy storage device to the upper computer.

According to an embodiment of the present disclosure, each of the plurality of monitors is further configured to disconnect from the upper computer when the display terminal performs a wireless communication with the monitor.

According to an embodiment of the present disclosure, the monitoring apparatus further includes a networking relay arranged between the plurality of monitors and the display terminal and configured to forward the operating parameters in the plurality of monitors to the display terminal.

According to an embodiment of the present disclosure, each of a plurality of energy storage devices includes a photovoltaic module, a solar charging controller, a battery, and an inverter, and each of the plurality of monitors includes: a photovoltaic monitor arranged between the photovoltaic module and the solar charging controller, and configured to: sample an output electrical signal of the photovoltaic module and an input electrical signal of the solar charging controller, determine a current value, a voltage value, a power, and power generation of the photovoltaic module based on the output electrical signal of the photovoltaic module and the input electrical signal of the solar charging controller, and perform an on-off control on a circuit between the photovoltaic module and the solar charging controller; a direct current (DC) load monitor arranged between a DC source and a DC load of the energy storage system, and configured to: sample an output electrical signal of the DC source and an input electrical signal of the DC load, determine a power and power consumption of the DC load based on the output electrical signal of the DC source and the input electrical signal of the DC load, perform an on-off control on a circuit between the DC source and the DC load, and perform overcurrent protection based on the output electrical signal of the DC source and the input electrical signal of the DC load; an alternating current (AC) load monitor arranged between the inverter and an AC load of the energy storage system, and configured to: sample an output electrical signal of the inverter and an input electrical signal of the AC load, determine a power and power consumption of the AC load based on the output electrical signal of the inverter and the input electrical signal of the AC load, perform an on-off control of a circuit between the inverter and the AC load, and perform overcurrent protection and leakage protection based on the output electrical signal of the inverter and the input electrical signal of the AC load; and a battery monitor adapted to be connected to the battery, and configured to: sample an input electrical signal of the battery and an output electrical signal of the battery, and determine a power, a residual capacity, an actual capacity, and a health state of the battery based on the input electrical signal of the battery and the output electrical signal of the battery.

According to an embodiment of the present disclosure, the photovoltaic monitor includes: a photovoltaic input interface adapted to be connected to the photovoltaic module; a photovoltaic output interface adapted to be connected to the solar charging controller; a first sampling calculator connected to the photovoltaic input interface and the photovoltaic output interface respectively, and configured to: sample the output electrical signal of the photovoltaic module and the input electrical signal of the solar charging controller, and determine the current value, the voltage value, the power, and the power generation of the photovoltaic module based on the output electrical signal of the photovoltaic module and the input electrical signal of the solar charging controller; a first network device connected to the first sampling calculator, supporting a wireless networking mode, and configured to transmit the current value, the voltage value, the power, and the power generation of the photovoltaic module to the display terminal; a first networking button, the first network device being further configured to enter a wireless networking mode in response to the first networking button being triggered; a first switch arranged between the photovoltaic input interface and the photovoltaic output interface; a first controller and a first switch button, the first controller having a power supply end connected to the photovoltaic module through the first switch button, and the first controller being connected to the first sampling calculator and configured to: control the first switch to be switched off in response to the output electrical signal of the photovoltaic module and/or the input electrical signal of the solar charging controller triggering protection; and a first display device connected to the first network device and the first controller respectively and configured to display a current operating state, a switching on-off state of the first switch, and a network connection state of the first network device.

According to an embodiment of the present disclosure, the DC load monitor includes: a DC input interface adapted to be connected to the DC source; at least one DC output interface, each of the at least one DC output interface adapted to be connected to one DC load; a second sampling calculator connected to the DC input interface and the at least one DC output interface respectively, and configured to: sample the output electrical signal of the DC source and the input electrical signal of the DC load, and determine the power and the power consumption of the DC load based on the output electrical signal of the DC source and the input electrical signal of the DC load; a second network device connected to the second sampling calculator, supporting a wireless networking mode, and configured to transmit the power and the power consumption of the DC load to the display terminal; a second networking button, the second network device being further configured to enter a wireless networking mode in response to the second networking button being triggered; a second switch arranged between the DC input interface and the at least one DC output interface; a second controller and a second switch button, the second controller having a power supply end connected to the DC source through the second switch button, and the second controller being connected to the second sampling calculator and configured to control the second switch to be switched off in response to a determination of an overcurrent output based on the output electrical signal of the DC source and the input electrical signal of the DC load; and a second display device connected to the second network device and the second controller respectively, and configured to display a switching on-off state of the second switch and a network connection state of the second network device.

According to an embodiment of the present disclosure, the AC load monitor includes: an AC input interface adapted to be connected to the inverter; at least one AC output interface, each of the at least one AC output interface adapted to be connected to one AC load; a third sampling calculator connected to the AC input interface and the at least one AC output interface respectively, and configured to: sample the output electrical signal of the inverter and the input electrical signal of the AC load, and determine the power and the power consumption of the AC load based on the output electrical signal of the inverter and the input electrical signal of the AC load; a third network device connected to the third sampling calculator, supporting a wireless networking mode, and configured to transmit the power and the power consumption of the AC load to the display terminal; a third networking button, the third network device being further configured to enter a wireless networking mode in response to the third networking button being triggered; a third switch arranged between the AC input interface and the at least one AC output interface; a power converter adapted to be connected to the inverter and configured to convert an alternating current generated by the inverter to generate a direct current; a third controller and a third switch button, the third controller having a power supply end connected to the power converter through the third switch button, and the third controller being connected to the third sampling calculator and configured to control the third switch to be switched off in response to a determination of an overcurrent output or an existence of leakage based on the output electrical signal of the inverter and the input electrical signal of the AC load; and a third display device connected to the third network device and the third controller respectively, and configured to display a switching on-off state of the third switch and a network connection state of the third network device.

According to an embodiment of the present disclosure, the battery monitor includes: a battery input interface adapted to connect the battery; a current sensor configured to sample an input current of the battery and an output current of the battery; a current detection interface connected to the current sensor; a fourth sampling calculator connected to the battery input interface and the current detection interface respectively, and configured to: sample a battery voltage and determine the power, the residual capacity, the actual capacity, and the health state of the battery based on the battery voltage, the input current, and the output current of the battery; a fourth network device connected to the fourth sampling calculator, supporting a wireless networking mode, and configured to forward the power, the residual capacity, the actual capacity, and the health state of the battery to the display terminal; a fourth networking button, the fourth network device further configured to enter a wireless networking mode in response to the fourth networking button being triggered; and a fourth display device connected to the fourth network device and configured to display a network connection state of the fourth network device.

To achieve the above object, according to a second aspect of the embodiments of the present disclosure, an energy storage system is provided. The system includes the monitoring apparatus for the energy storage system according to any of the above embodiments.

According to the energy storage system of the embodiments of the present disclosure, by adopting the above-mentioned monitoring apparatus, each monitor is configured to sample the input electrical signal and/or the output electrical signal of an energy storage device, and obtain the operating parameter of the energy storage device based on the input electrical signal and/or the output electrical signal of the energy storage device. Therefore, the monitor can obtain the operating parameter of the corresponding energy storage device of any brand. The monitor is further configured to transmit the operating parameter of the energy storage device to an upper computer through a display terminal, realizing the data integration of the plurality of energy storage devices. In this way, users do not have to switch application programs frequently, thereby saving their time.

Additional aspects and advantages of the embodiments of the present disclosure will be given at least in part in the following description, or become apparent at least in part from the following description or can be learned from practicing of the embodiments of the present disclosure.

DESCRIPTION OF EMBODIMENTS

Figure 1:
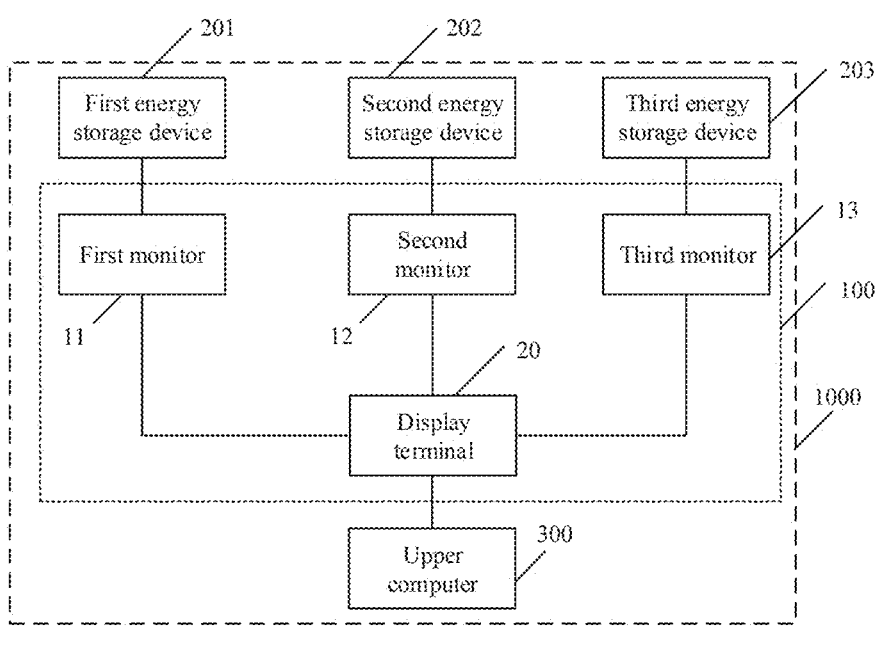
FIG. 1 is a schematic diagram showing a structure of an energy storage system according to an embodiment of the present disclosure.

Embodiments of the present disclosure will be described in detail below with reference to examples thereof as illustrated in the accompanying drawings, throughout which same or similar elements, or elements having same or similar functions, are denoted by same or similar reference numerals. The embodiments described below with reference to the drawings are illustrative only, and are intended to explain, rather than limiting, the present disclosure.

An energy storage system and a monitoring apparatus for the energy storage system of the embodiments of the present disclosure are described below with reference to the accompanying drawings.

FIG. 1 is a schematic diagram showing a structure of an energy storage system according to an embodiment of the present disclosure. As shown in FIG. 1, a monitoring apparatus for an energy storage system 100 includes a plurality of monitors 11 to 13 and a display terminal 20.

Each monitor is configured to sample an input electrical signal and/or an output electrical signal of one energy storage device and determine an operating parameter of the corresponding energy storage device based on the input electrical signal and/or the output electrical signal, and each monitor supports a wireless networking mode. The display terminal 20 is configured to perform a wireless communication with an upper computer 300, and transmit the operating parameter of the corresponding energy storage device to the upper computer 300 by performing a wireless communication with each monitor when each monitor operates in the wireless networking mode, to allow the upper computer 300 to display the operating parameter of the corresponding energy storage device.

In an exemplary embodiment of the present disclosure, the energy storage device includes a photovoltaic module, a solar charging controller, a combiner box, a battery, an inverter, and a direct current junction box. The operating parameters of different types of energy storage devices are determined through different monitors. As shown in FIG. 1, three energy storage devices are respectively a first energy storage device 201, a second energy storage device 202, and a third energy storage device 203, and the three energy storage devices are energy storage devices of different types. Therefore, three monitors are provided, which are respectively a first monitor 11, a second monitor 12, and a third monitor 13. The first monitor 11 is configured to determine an operating parameter of the first energy storage device 201. The second monitor 12 is configured to determine an operating parameter of the second energy storage device 202. The third monitor 13 is configured to determine an operating parameter of the third energy storage device 203. In practical applications, when an energy storage device needs to be added and if a type of the newly added energy storage device is the same as that of the first energy storage device 201, the newly added monitor is the first monitor 11. Each monitor is configured to sample the input electrical signal and/or the output electrical signal of one energy storage device and determine the operating parameter of the corresponding energy storage device based on the input electrical signal and/or the output electrical signal. The corresponding energy storage device and the energy storage device on that the sampling is performed can be energy storage devices of different types. For example, a monitor is configured to determine an operating parameter of the photovoltaic module, but the monitor, by sampling an input electrical signal of the solar charging controller, obtains the operating parameter of the photovoltaic module based on the input electrical signal of the solar charging controller. Therefore, each of the plurality of monitors 11 to 13 does not depend on operating parameters collected or stored by the energy storage device itself, but directly obtains the operating parameter of the energy storage device based on the input electrical signal and/or output electrical signal of the energy storage device. In this way, each of the plurality of monitors 11 to 13 can obtain the operating parameter of the corresponding energy storage device of any brand. The display terminal 20 is configured to perform a wireless communication with the upper computer 300 and the plurality of monitors 11 to 13 respectively. The same communication protocol is adopted between the display terminal 20 and the plurality of monitors 11 to 13, allowing that data transmission can be realized. The display terminal 20 is configured to transmit a data query instruction to the plurality of monitors 11 to 13. Each of the plurality of monitors 11 to 13 is configured to transmit an operating parameter of the energy storage device to the display terminal 20 in response to receiving the data query instruction. The display terminal 20 is configured to transmit the operating parameter of the energy storage device to the upper computer 300, thereby realizing a centralized display of the operating parameter of the energy storage device on the upper computer 300, and realizing the data integration of the plurality of energy storage devices.

It should be noted that, in practical applications, the number of energy storage devices and the number of monitors are not limited to three, and the three energy storage devices and three monitors shown in FIG. 1 are exemplary and not limitations to the present disclosure. The display terminal 20 can perform a wireless communication with the upper computer 300 through Bluetooth or Wireless Fidelity (WIFI). When the upper computer 300 is a server, the display terminal 20 communicates with the server through WIFI, and an application program of a mobile phone obtains an operating parameter of the energy storage device from the server. In this way, the user can view the operating parameter in the application program of the mobile phone. When the upper computer 300 is a mobile phone, the display terminal 20 communicates with the mobile phone through Bluetooth. The application program of the mobile phone can directly obtain the operating parameter of the energy storage device through Bluetooth communication, and then the user can view the operating parameter in the application program of the mobile phone. Since the data format of the mobile phone is different from that of the operating parameter, the display terminal 20 needs to convert the format of the operating parameter. In this way, the mobile phone can display the operating parameter. The user can perform a control operation on the energy storage device in the mobile phone application program, and the display terminal 20 will transmit a control instruction to the corresponding monitor, and the monitor will perform a corresponding operation based on the control instruction.

Figure 2:
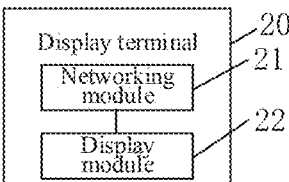
FIG. 2 is a schematic diagram showing a structure of a display terminal according to an embodiment of the present disclosure.

In another exemplary embodiment of the present disclosure, as shown in FIG. 2, the display terminal 20 includes an upgrade interface (not shown in the figure), a networking module 21, and a display module 22. The upgrade interface is configured to connect to the upper computer 300 to allow the upper computer 300 to perform a firmware code upgrade on the display terminal 20. Therefore, the user can directly perform a firmware code upgrade on the display terminal 20 through the upper computer 300. In this way, professional maintenance personnel are not required to upgrade the display terminal and a new display terminal 20 is not required through replacing, thereby further saving time for the user. The networking module 21 can perform wireless networking with the plurality of monitors 11 to 13, and can further perform a wireless communication with the upper computer 300. The networking module 21 can be a Bluetooth module. The display module 22 includes a display screen (not shown in the figure) configured to display the operating parameter of the energy storage device, and a first monochromatic indicator light (not shown in the figure) configured to indicate an operating state of the display terminal 20. The display screen can be used not only to display the operating parameter, but also to set a control instruction by the user for the monitor and select by the user an operating mode of the display terminal 20. For example, the user can select a state of a controllable switch in the monitor or input a parameter of the monitor on the display screen, and the display screen generates a control instruction based on the selected switching on-off state and the input parameter. Then, the display terminal 20 issues the control instruction to the corresponding monitor. The operating mode of the display terminal 20 include a search mode and a data collection mode. When the display terminal 20 is required to establish a wireless network connection with the monitor, the user needs to operate the display screen to allow the display terminal 20 to enter the search mode. The display terminal 20 searches for a monitor in a connection-to-access state, and establishes a wireless network connection and information interaction with the monitor, allowing the monitor and the display terminal 20 to be successfully networked. After successful networking, the display terminal 20 automatically enters the data collection mode. When the display terminal 20 is in the operating state, a first indicator light is on, and when the display terminal 20 is not in the operating state, the first indicator light is off.

It should be noted that in response to the plurality of monitors 11 to 13 being in the network access state, since the display terminal 20 performs a wireless communication with the mobile phone, the user can transmit a preset command to the display terminal 20 through the application program of the mobile phone to allow the display terminal 20 to enter the search mode. The display terminal 20 performs wireless networking with the monitor, and the display terminal 20 automatically enters the data collection mode after successful networking.

In the above embodiment, the monitor is configured to sample the output electrical signal of an energy storage device, and obtain the operating parameter of the energy storage device based on the output electrical signal of the energy storage device. Therefore, the monitor can obtain the operating parameter of the corresponding energy storage device of any brand, and the monitor is further configured to transmit the operating parameter of the energy storage device to the upper computer through the display terminal, realizing the data integration of the plurality of energy storage devices. In this way, users do not have to switch application programs frequently, thereby saving their time. In addition, the monitor and display terminal are in wireless communication with each other, thus avoiding space constraints and wiring harnesses associated with wired connections.

Figure 3:
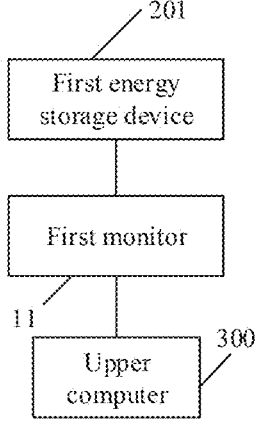
FIG. 3 is a schematic diagram showing a structure of an energy storage system according to another embodiment of the present disclosure.

In some embodiments, as shown in FIG. 3, the monitor is further configured to perform a wireless communication with the upper computer 300 to transmit the operating parameter of the corresponding energy storage device to the upper computer 300.

In an exemplary embodiment of the present disclosure, as shown in FIG. 3, the first monitor 11 can directly perform a wireless communication with the upper computer 300 through Bluetooth, and directly transmit the operating parameter of the first energy storage device 201 to the upper computer 300. The upper computer 300 displays the operating parameter of the first energy storage device 201.

It should be noted that when the upper computer 300 adopts Bluetooth 5.0, the upper computer 300 can be in wireless communication with the plurality of monitors 11 to 13 at the same time. When the upper computer 300 adopts Bluetooth technology before Bluetooth 5.0, the upper computer 300 can only be connected to one monitor. Therefore, the upper computer 300 can only display the operating parameter of one monitor.

In some embodiments, each of the plurality of monitors 11 to 13 is further configured to disconnect from the upper computer 300 when the display terminal 20 performs a wireless communication with the plurality of monitors 11 to 13.

It is understood that communication submodules of the plurality of monitors 11 to 13 cannot be connected to two devices at the same time, and therefore each of the plurality of monitors 11 to 13 cannot be connected to upper computer 300 and display terminal 20 at the same time. When each of the plurality of monitors 11 to 13 performs a wireless communication with the display terminal 20, the wireless communication between the monitor among the plurality of monitors 11 to 13 and the upper computer 300 is disconnected. When each of the plurality of monitors 11 to 13 performs a wireless communication with the upper computer 300, the wireless communication between the monitor among the plurality of monitors 11 to 13 and the display terminal 20 is disconnected. The user can switch a connection mode by operating the plurality of monitors 11 to 13, and a specific operation manner will be described in detail below.

Figure 4:
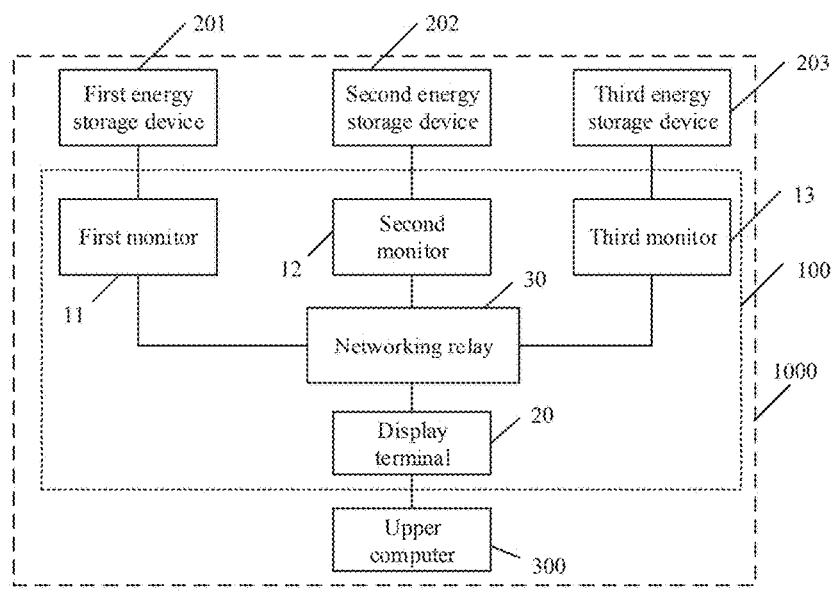
FIG. 4 is a schematic diagram showing a structure of an energy storage system according to another embodiment of the present disclosure.

In some embodiments, as shown in FIG. 4, the monitoring apparatus 100 further includes a networking relay 30 disposed arranged between the plurality of monitors 11 to 13 and the display terminal 20 and configured to forward the operating parameters in the plurality of monitors 11 to 13 to the display terminal 20.

In an exemplary embodiment of the present disclosure, the plurality of monitors 11 to 13 can be directly communicatively connected to the display terminal 20 when a distance between the plurality of monitors 11 to 13 and the display terminal 20 is relatively close and there is no obstruction by too many obstacles. However, when the distance between the plurality of monitors 11 to 13 and the display terminal 20 is far, or there is obstruction by too many obstacles between the plurality of monitors 11 to 13 and the display terminal 20, the signal strength between the plurality of monitors 11 to 13 and the display terminal 20 will be poor, resulting in abnormal communication between the plurality of monitors 11 to 13 and the display terminal 20. Therefore, the networking relay 30 is required to relay the data transmission between the plurality of monitors 11 to 13 and the display terminal 20 to enhance the signal strength between the plurality of monitors 11 to 13 and the display terminal 20. In this way, the plurality of monitors 11 to 13 and the display terminal 20 can communicate with each other normally.

It should be noted that the display terminal 20 can be connected to a plurality of networking relays 30 at the same time, and there is no limitation on the number of the networking relays. When the distance between the display terminal 20 and the plurality of monitors 11 to 13 is relatively far, or there are many obstacles between them, the plurality of networking relays 30 can be used for data transfer.

Figure 5:
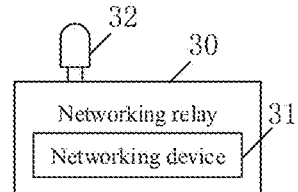
FIG. 5 is a schematic diagram showing a structure of a networking relay according to an embodiment of a present disclosure.

In another exemplary embodiment of the present disclosure, as shown in FIG. 5, the networking relay 30 includes a networking device 31, a networking button (not shown in the figure), and a display device 32. The networking device 31 supports the wireless networking mode. The networking device 31 switches the network connection state in response to the networking button being triggered, and a second display device 32 is configured to display the network connection state of the networking device 31. The networking device 31 has a connection-to-access state and a network access state in the networking mode. When the networking device 31 stores network information of the display terminal 20, the networking device 31 enters the network access state and performs a wireless communication with the display terminal 20. When the networking relay 30 needs to perform a wireless communication with other display terminals 20, the networking device 31 can enter the connection-to-access state through operating the networking button and then perform a wireless communication with other display terminals 20. Before successfully connecting to other display terminals 20, the networking relay 30 can connect to a previous display terminal 20 at any time. After successfully connecting to other display terminals 20, the networking device 31 clears network information of the previous display terminal 20 and enters the network access state. When the networking device 31 does not store the network information of the display terminal 20, the networking device 31 enters the connection-to-access state, and then waits for the display terminal 20 to be connected. The display terminal 20 and the networking device 31 exchange network information with each other. Before the networking device 31 is successfully connected to the display terminal 20, the networking device 31 cannot enter the network access state through operating the networking button. The display device 32 changes based on the network connection state of the networking device 31 to prompt the user of the network connection state of the networking relay 30. The display device 32 can be a second monochromatic indicator light.

In the above embodiment, data transmission between the monitor and the display terminal is transferred through the networking relay. In this way, the strength of the data signal between the monitor and the display terminal can be increased, thereby ensuring the stability of the monitoring apparatus.

Figure 6:
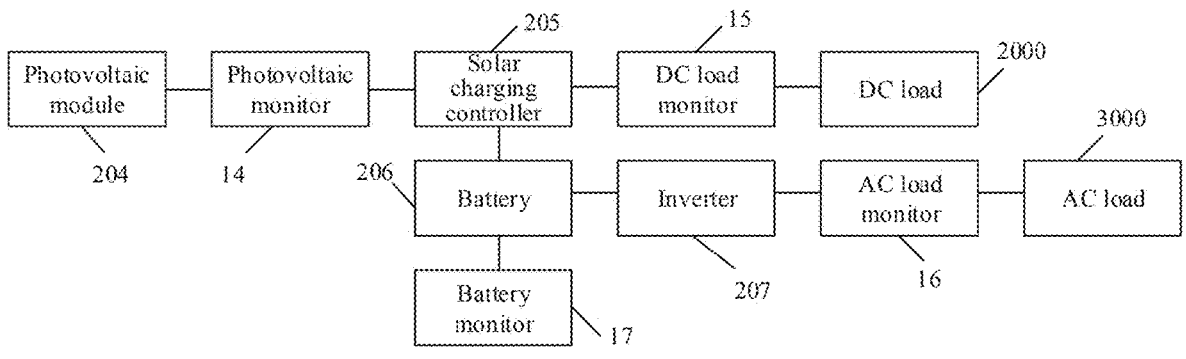
FIG. 6 is a schematic diagram of a connection between a monitor and an energy storage device according to an embodiment of the present disclosure.
Figure 7:
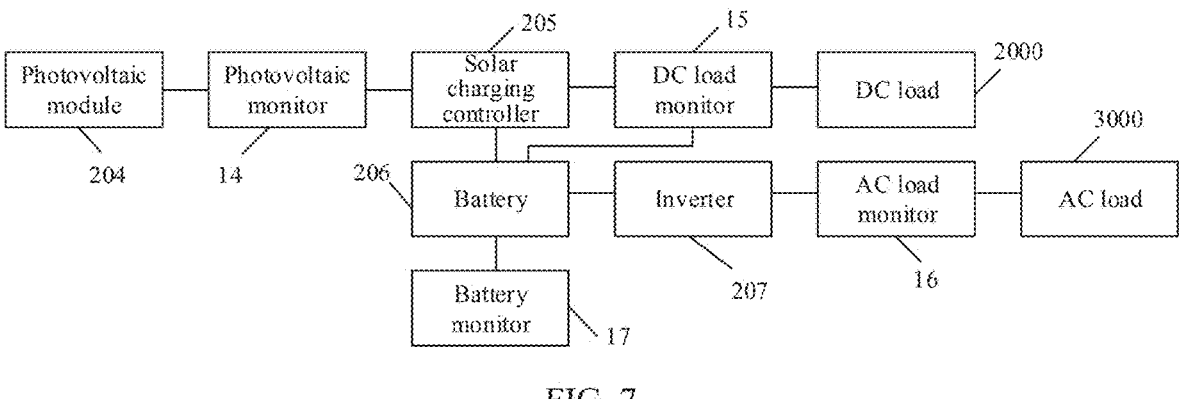
FIG. 7 is a schematic diagram of a connection between a monitor and an energy storage device according to another embodiment of the present disclosure.

In some embodiments, as shown in FIG. 6 and FIG. 7, each of a plurality of energy storage devices includes a photovoltaic module 204, a solar charging controller 205, a battery 206, and an inverter 207. Each of the plurality of monitors includes a photovoltaic monitor 14, a direct current (DC) load monitor 15, an alternating current (AC) load monitor 16, and a battery monitor 17. The photovoltaic monitor 14 is arranged between the photovoltaic module 204 and the solar charging controller 205, and configured to: sample an output electrical signal of the photovoltaic module 204 and an input electrical signal of the solar charging controller 205, determine a current value, a voltage value, a power, and power generation of the photovoltaic module 204 based on the output electrical signal of the photovoltaic module 204 and the input electrical signal of the solar charging controller 205, and perform an on-off control on a circuit between the photovoltaic module 204 and the solar charging controller 205. The DC load monitor 15 is arranged between a DC source and a DC load 2000 of the energy storage system, and configured to: sample an output electrical signal of the DC source and an input electrical signal of the DC load 2000, determine a power and power consumption of the DC load 2000 based on the output electrical signal of the DC source and the input electrical signal of the DC load 2000, perform an on-off control on a circuit between the DC source and the DC load 2000, and perform overcurrent protection based on the output electrical signal of the DC source and the input electrical signal of the DC load 2000. The AC load monitor 16 is arranged between the inverter 207 and an AC load 3000 of the energy storage system, and configured to: sample an output electrical signal of the inverter 207 and an input electrical signal of the AC load 3000, determine a power and power consumption of the AC load 3000 based on the output electrical signal of the inverter 207 and the input electrical signal of the AC load 3000, perform an on-off control of a circuit between the inverter 207 and the AC load 3000, and perform overcurrent protection and leakage protection based on the output electrical signal of the inverter 207 and the input electrical signal of the AC load 3000. The battery monitor 17 is adapted to be connected to the battery 206, and configured to: sample an input electrical signal of the battery 206 and an output electrical signal of the battery 206, and determine a power, a residual capacity, an actual capacity, and a health state of the battery 206 based on the input electrical signal of the battery 206 and the output electrical signal of the battery 206.

In an exemplary embodiment of the present disclosure, the plurality of energy storage devices includes the photovoltaic module 204, the solar charging controller 205, the battery 206, and the inverter 207. The photovoltaic monitor 14 is arranged between the photovoltaic module 204 and the solar charging controller 205, and configured to: sample the output electrical signal of the photovoltaic module 204 and the input electrical signal of the solar charging controller 205, determine the current value, the voltage value, the power, and the power generation of the photovoltaic module 204 based on the output electrical signal of the photovoltaic module 204 and the input electrical signal of the solar charging controller 205. The power generation includes daily power generation, monthly power generation, and total power generation. In addition, the photovoltaic monitor 14 can control an on-off state of the photovoltaic monitor 14 to control an on-off state between the photovoltaic module 204 and the solar charging controller 205. The DC load monitor 15 is arranged between the DC source and the DC load 2000, and the DC source can be the solar charging controller 205 as shown in FIG. 6, or the battery 206 as shown in FIG. 7, or other energy storage devices, such as a voltage stabilizer and a DC distribution box, which are not limited herein. The DC load monitor 15 is configured to: sample the output electrical signal of the DC source and the input electrical signal of the DC load 2000, and determine the power and power consumption of the DC load 2000 based on the output electrical signal of the DC source and the input electrical signal of the DC load 2000. The power consumption is the sum of the power consumption of all DC loads 2000, including daily power consumption, monthly power consumption, and total power consumption. In addition, the DC load monitor 15 can control its own on-off state to control an on-off state between the DC source and the DC load 2000, thereby achieving cut off of the DC load 2000. Further, the DC load monitor 15 has an overcurrent protection function, so that open circuit or overload of the DC load monitor 15 can be avoided. The AC load monitor 16 is arranged between the inverter 207 and the AC load 3000, and the inverter 207 is connected to the battery 206. The AC load monitor 16 is configured to: generate an alternating current based on the electric energy of the battery 206 to supply power to the AC load 3000. The AC load monitor 16 is configured to: sample the output electrical signal of inverter 207 and the input electrical signal of the AC load 3000, and determine the power and power consumption of the AC load 3000 based on the output electrical signal of the inverter 207 and the input electrical signal of the AC load 3000. The AC load monitor 16 is further configured to control its own on-off state to control an on-off state between the inverter 207 and the AC load 3000. In addition the AC load monitor 16 has an overcurrent protection function and a leakage protection function. The battery monitor 17 is adapted to be connected to the battery 206 and configured to: sample the input electrical signal of the battery 206 and the output electrical signal of the battery 206 and determine a charging power, a discharging power, the residual capacity, the actual capacity, and the health state of the battery 206 based on the input electrical signal of the battery 206 and the output electrical signal of the battery 206.

It should be noted that the monitor is not limited to the four monitors 14 to 17 mentioned above, but can be further added with a new monitor. The new monitor can be set based on the energy storage device, the details of which are not limited here.

Figure 8:
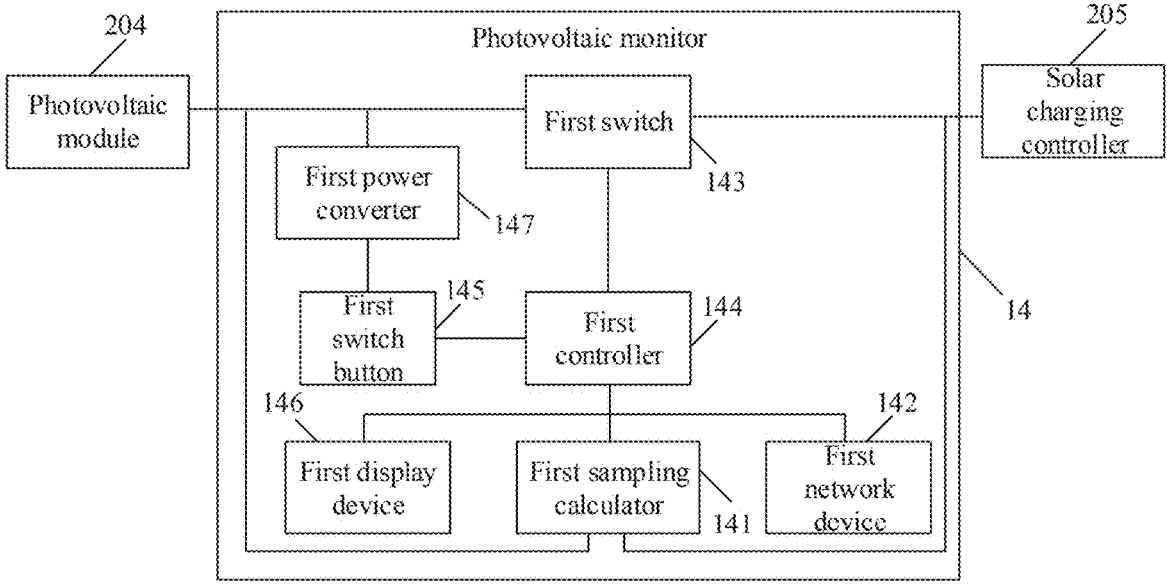
FIG. 8 is a schematic diagram showing a structure of a photovoltaic monitor according to an embodiment of the present disclosure.

In some embodiments, as shown in FIG. 8, the photovoltaic monitor 14 includes a photovoltaic input interface (not shown in the figure), a photovoltaic output interface (not shown in the figure), a first sampling calculator 141, a first network device 142, a first networking button (not shown in the figure), a first switch 143, a first controller 144, a first switch button 145, and a first display device 146. The photovoltaic input interface is adapted to be connected to the photovoltaic module 204. The photovoltaic output interface is adapted to be connected to the solar charging controller 205. The first sampling calculator 141 is connected to the photovoltaic input interface and the photovoltaic output interface, respectively, and configured to: sample the output electrical signal of the photovoltaic module 204 and the input electrical signal of the solar charging controller 205, and determine the current value, the voltage value, the power, and the power generation of the photovoltaic module 204 based on the output electrical signal of the photovoltaic module 204 and the input electrical signal of the solar charging controller 205. The first network device 142 is connected to the first sampling calculator 141, supports a wireless networking mode, and is configured to transmit the current value, the voltage value, the power, and the power generation of the photovoltaic module 204 to the display terminal. The first network device 142 is further configured to enter a wireless networking mode in response to the first networking button being triggered. The first switch 143 is arranged between the photovoltaic input interface and the photovoltaic output interface. The first controller 144 has a power supply end connected to the photovoltaic module 204 through the first switch button 145. The first controller 144 is connected to the first sampling calculator 141 and configured to control the first switch 143 to be switched off in response to the output electrical signal of the photovoltaic module 204 and/or the input electrical signal of the solar charging controller 205 triggering protection. The first display device 146 is connected to the first network device 142 and the first controller 144, respectively, and configured to display a current operating state, a switching on-off state of the first switch 143, and a network connection state of the first network device 142.

In an exemplary embodiment of the present disclosure, the first sampling calculator 141 is configured to sample an input voltage of the photovoltaic input interface and an output current of the photovoltaic output interface, and determine the current value, the voltage value, the power, and the power generation of the photovoltaic module 204 based on the input voltage of the photovoltaic input interface and the output current of the photovoltaic output interface. By pressing and holding the first networking button, the first network device 142 can be switched into a single-connection mode or a wireless networking mode. In the single-connection mode, the photovoltaic monitor 14 is directly in wireless communication with the upper computer 300 (e.g., a mobile phone), and the photovoltaic monitor 14 directly transmits the current value, the voltage value, the power, and the power generation to the application program of the mobile phone. The application program of the mobile phone parses and displays the power generation. When the user performs a setting operation on the photovoltaic monitor 14 at the application program of the mobile phone, the application program of the mobile phone transmits a control instruction to the photovoltaic monitor 14, and the photovoltaic monitor 14 executes a corresponding operation in response to receiving the control instruction. The photovoltaic monitor 14 has a connection-to-access state and a network access state in the wireless networking mode. When the first network device 142 stores the network information of the display terminal 20, the first network device 142 enters the network access state and performs a wireless communication with the display terminal 20. When the photovoltaic monitor 14 needs to perform a wireless communication with other display terminals 20, the first networking button can be pressed to allow the first network device 142 to enter the connection-to-access state and then the first network device 142 performs a wireless communication with other display terminals 20. Before successfully connecting to other display terminals 20, the photovoltaic monitor 14 can connect to a previous display terminal 20 at any time. After successfully connecting to other display terminals 20, the first network device 142 clears network information of the previous display terminal 20 and enters the network access state. When the first network device 142 does not store the network information of the display terminal 20, the first network device 142 enters the connection-to-access state, and then waits for the display terminal 20 to connect. The display terminal 20 and the first network device 142 exchange network information with each other. Before the first network device 142 is successfully connected to the display terminal 20, the first network device 142 cannot enter the network access state through operating the first networking button. After the first network device 142 is successfully networked, the first sampling calculator 141 transmits the current value, the voltage value, the power, and the power generation of the photovoltaic module 204 to the upper computer 300 or the display terminal 20 through the first network device 142.

The first switch 143 is arranged between the photovoltaic input interface and the photovoltaic output interface, and can be a switch. The first controller 144 is configured to control an on-off of the first switch 143 to control an on-off state of the photovoltaic monitor 14. The power supply end of the first controller 144 is connected to the photovoltaic module 204 through the first switch button 145. The photovoltaic module 204 is configured to supply power to the first controller 144 when the first switch button 145 is in the on state. After the user operates the first switch button 145, a path between the photovoltaic module 204 and the first controller 144 is disconnected, and the photovoltaic module 204 stops supplying power to the first controller 144. The first controller 144 is powered down, so the first switch 143 is switched off. The photovoltaic monitor 14 further has high voltage protection and overcurrent protection. In response to the output electrical signal of the photovoltaic module 204 and/or the input electrical signal of the solar charging controller 205 triggering the high voltage protection and the overcurrent protection, the first controller 144 controls the first switch 143 to be switched off to cut off the path between a photovoltaic module 204 and the solar charging controller 205. The user can set a switching on-off state of the first switch 143 at an application (APP) of the mobile phone. The APP of the mobile phone can transmit a control instruction to the photovoltaic monitor 14 directly or through the display terminal, and the first controller 144 controls the first switch 143 based on the control instruction.

In another exemplary embodiment of the present disclosure, the photovoltaic monitor 14 further includes a first power converter 147 arranged between the first switch button 145 and the photovoltaic module 204 and configured to convert electrical energy output by the photovoltaic module 204 and then power the first controller 144 in response to the first switch button 145 being switched on. The first display device 146 includes a third monochromatic indicator light (not shown in the figure), a first bi-color indicator light (not shown in the figure), and a second bi-color indicator light (not shown in the figure). The third monochromatic indicator light indicates the switching on-off state of the first switch 143. The third monochromatic indicator light is on which indicates that the first switch 143 is in the on state, and the third monochromatic indicator light is off which indicates that the first switch 143 is in the off state. The first bi-color indicator light indicates a current operating state of the photovoltaic monitor 14. When the first bi-color indicator light is green, the photovoltaic monitor 14 is in a normal operating state. When the first bi-color indicator light is red, the photovoltaic monitor 14 is malfunctioning, e.g., due to the fact that the first switch 143 cannot be switched off and remains energized at all times. The photovoltaic monitor 14 further has a first switch failure warning function and an input low voltage protection function. The second bi-color indicator light indicates the network connection state of the first network device 142. In the single-connection mode of the first network device 142, the first network device 142 is successfully connected to the upper computer 300 when the blue light is always on; and when the blue light flashes, the first network device 142 is not connected to the upper computer 300. In the wireless networking mode of the first network device 142, the first network device 142 is in the connection-to-access state when the green light flashes rapidly; and when the green light is always on, the first network device 142 is successfully networked; and when the green light flashes slowly, the first network device 142 fails to find the display terminal 20.

Figure 9:
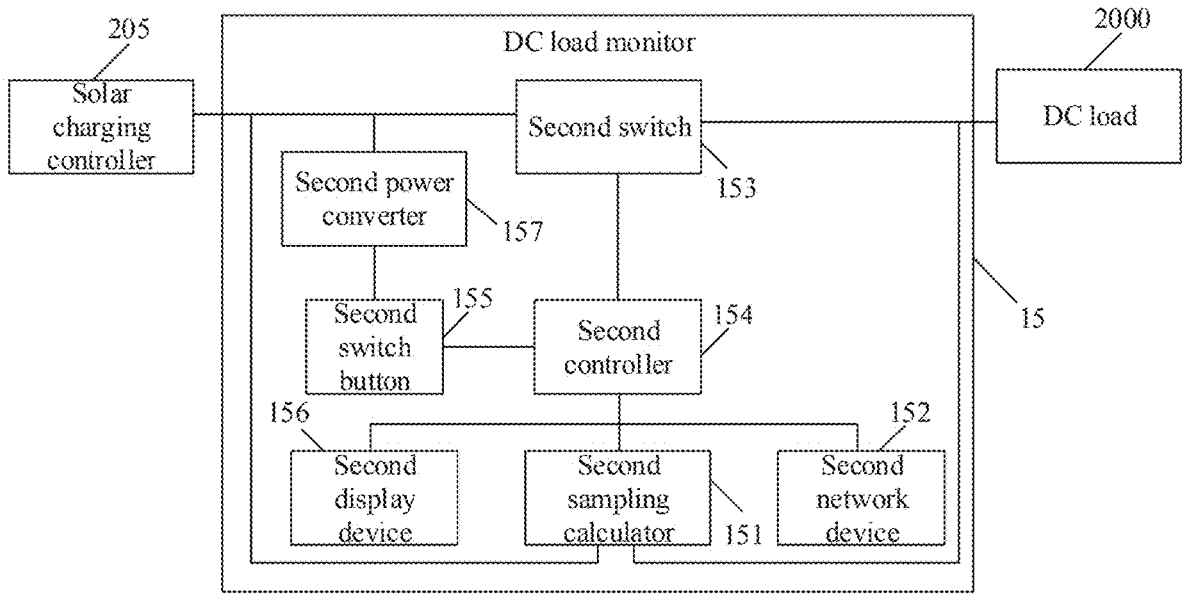
FIG. 9 is a schematic diagram showing a structure of a DC load monitor according to an embodiment of the present disclosure.

In some embodiment, as shown in FIG. 9, the DC load monitor 15 includes a DC input interface (not shown in the figure), at least one DC output interface (not shown in the figure), a second sampling calculator 151, a second network device 152, a second networking button (not shown in the figure), a second switch 153, a second controller 154, a second switch button 155, and a second display device 156. The DC input interface is adapted to be connected to the DC source. Each DC output interface is adapted to be connected to one DC load 2000. The second sampling calculator 151 is connected to the DC input interface and the at least one DC output interface respectively, and configured to: sample the output electrical signal of the DC source and the input electrical signal of the DC load 2000, and determine the power and power consumption of the DC load 2000 based on the output electrical signal of the DC source and the input electrical signal of the DC load 2000. The second network device 152 is connected to the second sampling calculator 151, supports a wireless networking mode, and is configured to transmit the power and the power consumption of the DC load 2000 to the display terminal. The second network device 152 is further configured to enter a wireless networking mode in response to the second networking button being triggered. The second switch 153 is arranged between the DC input interface and the at least one DC output interface. The second controller 154 has a power supply end connected to the DC source through the second switch button 155. The second controller 154 is connected to the second sampling calculator 151 and configured to control the second switch 153 to be switched off in response to a determination of an overcurrent output based on the output electrical signal of the DC source and the input electrical signal of the DC load 2000. The second display device 156 is connected to the second network device 152 and the second controller 154 respectively, and configured to display a current operating state, a switching on-off state of the second switch 153, and a network connection state of the second network device 152.

In an exemplary embodiment of the present disclosure, a number of DC output interfaces can be set based on a number of DC load 2000, such as six DC output interfaces. As shown in FIG. 9, taking the DC source being the solar charging controller 205 as an example, the second sampling calculator 151 is configured to sample the input voltage of the DC input interface and an output current of each DC output interface, and determine operating parameters such as power and power consumption of all DC loads 2000 based on the input voltage of the DC input interface and the output current of each DC output interface. By pressing and holding the second networking button, the second network device 152 is switched into a single-connection mode or a wireless networking mode. In the single-connection mode, the DC load monitor 15 is directly in wireless communication with the upper computer 300, and directly transmits all operating parameters such as the power and the power consumption of all the DC loads 2000 to the application program of the mobile phone. The application program of the mobile phone parses and displays the operating parameters. When the user performs a setting operation on the DC load monitor 15 at the application program of the mobile phone, the application program of the mobile phone transmits a control instruction to the DC load monitor 15, and the DC load monitor 15 executes a corresponding operation in response to receiving the control instruction. In the wireless networking mode of the DC load monitor 15, the DC load monitor 15 further has a connection-to-access state and a network access state. When the second network device 152 stores the network information of the display terminal 20, the second network device 152 enters the network access state and performs a wireless communication with the display terminal 20. When the DC load monitor 15 needs to perform a wireless communication with other display terminals 20, the second networking button can be pressed to allow the second network device 152 to enter the connection-to-access state and then to perform a wireless communication with other display terminals 20. Before successfully connecting to other display terminals 20, the DC load monitor 15 can connect to the previous display terminal 20 at any time. After successfully connecting to other display terminals 20, the second network device 152 clears the network information of the previous display terminal 20, and enters the network access state. When the second network device 152 does not store the network information of the display terminal 20, the second network device 152 enters the connection-to-access state, and then waits for the display terminal 20 to connect. The display terminal 20 and the second network device 152 exchange network information with each other. Before the second network device 152 is successfully connected to the display terminal 20, the second network device 152 cannot enter the network access state through operating the second networking button. After the second network device 152 is successfully networked, the second sampling calculator 151 transmits the operating parameters such as the power and the power consumption of the DC load 2000 to the upper computer 300 or the display terminal 20 through the second network device 152.

The second switch 153 is arranged between the DC input interface and the DC output interface and includes at least one switch. A number of switches in the second switch 153 is the same as a number of DC output interfaces. Each switch is arranged between the DC input interface and one DC output interface. The second controller 154 is configured to control the on-off of the second switch 153 to control an on-off state of the DC load monitor 15. The power supply end of the second controller 154 is connected to the solar charging controller 205 through the second switch button 155. The solar charging controller 205 is configured to supply power to the second controller 154 in response to the second switch button 155 being in the on state. After the user operates the second switch button 155, a path between the solar charging controller 205 and the second controller 154 is disconnected, and the solar charging controller 205 stops supplying power to the second controller 154. The second controller 154 is powered down, so the second switch 153 is switched off. The DC load monitor 15 further has high voltage protection and overcurrent protection. In response to the output electrical signal of the solar charging controller 205 and/or the input electrical signal of the DC load 2000 triggering the high voltage protection and the overcurrent protection, the second controller 154 controls the second switch 153 to be switched off to cut off the path between the solar charging controller 205 and the DC load 2000. The user can set a switching on-off state of the second switch 153 on the APP of the mobile phone. The APP of the mobile phone can transmit a control instruction to the DC load monitor 15 directly or through the display terminal, and the second controller 154 controls the second switch 153 based on the control instruction.

In another exemplary embodiment of the present disclosure, as shown in FIG. 9, the DC load monitor 15 further includes a second power converter 157 arranged between the second switch button 155 and the DC source and configured to convert electrical energy output by the DC source and then power the second controller 154 in response to the second switch button 155 being switched on. The second display device 156 includes at least one third bi-color indicator light (not shown in the figure) and a fourth bi-color indicator light (not shown in the figure). A number of the third bi-color indicator lights is the same as a number of DC output interfaces. For example, if six DC output interfaces are provided, six switches are provided in the second switch 153 and six third bi-color indicator lights are provided. Each third bi-color indicator lights indicates a switching on-off state of one switch in the second switches 153 and a current operating state of the DC load monitor 15. When the third bi-color indicator light is green, the corresponding switch in the second switches 153 is in the on state. When the third bi-color indicator light is red, the DC load monitor 15 is in a fault state, and when the third bi-color indicator light is off, the DC load monitor 15 is in the off state. The DC load monitor 15 further has a low voltage protection function, and the user can turn on or off the low voltage protection function on the APP of the mobile phone. The fourth bi-color indicator light indicates the network connection state of the second network device 152. In the single-connection mode of the second network device 152, when a blue light is always on, the second network device 152 is successfully connected to the upper computer 300; and when the blue light flashes, the second network device 152 is not connected to the upper computer 300. In the wireless networking mode of the second network device 152, when a green light flashes rapidly, the second network device 152 is in the connection-to-access state; and when the green light is always on, the second network device 152 is successfully networked; and when the green light flashes slowly, the second network device 152 fails to find the display terminal 20.

Figure 10:
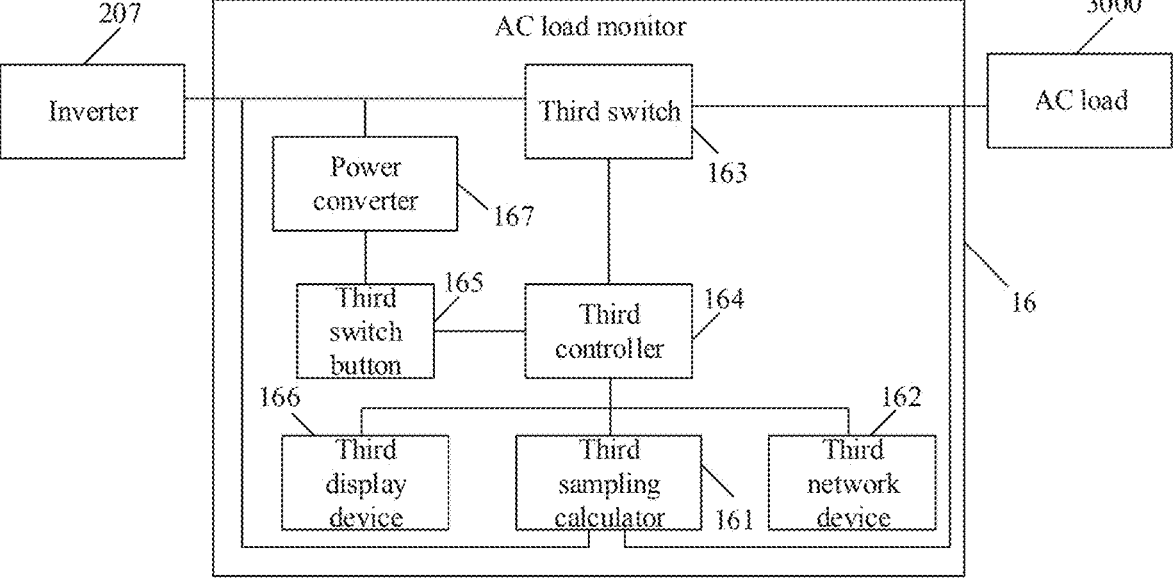
FIG. 10 is a schematic diagram showing a structure of an AC load monitor according to an embodiment of the present disclosure.

In some embodiments, as shown in FIG. 10, the AC load monitor 16 includes an AC input interface (not shown in the figure), at least one AC output interface (not shown in the figure), a third sampling calculator 161, a third network device 162, a third networking button (not shown in the figure), a third switch 163, a power converter 167, a third controller 164, a third switch button 165, and a third display device 166. The AC input interface is adapted to be connected to the inverter 207. Each AC output interface is adapted to be connected to one AC load 3000. The third sampling calculator 161 is connected to the AC input interface and the at least one AC output interface respectively, and configured to: sample the output electrical signal of inverter 207 and the input electrical signal of the AC load 3000, and determine the power and the power consumption of the AC load based on the output electrical signal of the inverter 207 and the input electrical signal of the AC load 3000. The third network device 162 is connected to the third sampling calculator 161, supports a wireless networking mode, and is configured to transmit the power and the power consumption of the AC load 3000 to the display terminal. The third network device 162 is further configured to enter a wireless networking mode in response to the third networking button being triggered. The third switch 163 is arranged between the AC input interface and the at least one AC output interface. The power converter 167 is adapted to be connected to the inverter 207 and configured to convert an alternating current generated by the inverter 207 to generate a direct current. The third controller 164 has a power supply end connected to the power converter 167 through the third switch button 165. The third controller 164 is connected to the third sampling calculator 161, and configured to control the third switch 163 to be switched off in response to a determination of an overcurrent output or an existence of leakage based on the output electrical signal of the inverter 207 and the input electrical signal of the AC load 3000. The third display device 166 is connected to the third network device 162 and the third controller 164 respectively, and configured to display a switching on-off state of the third switch 163 and a network connection state of the third network device 162.

In an exemplary embodiment of the present disclosure, a number of the AC output interfaces can be set based on a number of the AC loads 3000, and the form of the AC output interface can be a terminal, a socket, and the like. For example, five AC output interfaces are provided. Each of the five AC output interfaces is in the form of terminals, or two of the five AC output interfaces are in the form of sockets and three of the five AC output interfaces are in the form of terminals. The third sampling calculator 161 is configured to sample an input voltage of the AC input interface and an output current of each AC output interface, and determine operating parameters such as the power and the power consumption of the AC load 3000 based on the input voltage of the AC input interface and the output current of each AC output interface. By pressing and holding the third networking button, the third network device 162 is switched into a single-connection mode or a wireless networking mode. In the single-connection mode, the AC load monitor 16 is directly in wireless communication with the upper computer 300, and directly transmits operating parameters such as power and power consumption to the application program of the mobile phone. The application program of the mobile phone parses and displays the operating parameters such as the power and the power consumption of the AC load 3000. When the user performs a setting operation on the AC load monitor 16 at the application program of the mobile phone, the application program of the mobile phone transmits a control instruction to the AC load monitor 16, and the AC load monitor 16 executes a corresponding operation in response to receiving the control instruction. In the wireless networking mode of the AC load monitor 16, the AC load monitor 16 further has a connection-to-access state and a network access state. When the third network device 162 stores the network information of the display terminal 20, the third network device 162 enters the network access state and performs a wireless communication with the display terminal 20. When the AC load monitor 16 needs to perform a wireless communication with other display terminals 20, the third networking button can be pressed to allow the third network device 162 to enter the connection-to-access state and then to perform a wireless communication with other display terminals 20. Before successfully connecting to other display terminals 20, the AC load monitor 16 can connect to the previous display terminal 20 at any time. After successfully connecting to other display terminals 20, the third network device 162 clears the network information of the previous display terminal 20, and enters the network access state. When the third network device 162 does not store the network information of the display terminal 20, the third network device 162 enters the connection-to-access state, and then waits for the display terminal 20 to connect. The display terminal 20 and the third network device 162 exchange network information with each other. Before the third network device 162 is successfully connected to the display terminal 20, the third network device 162 cannot enter the network access state through operating the third networking button. After the third network device 162 is successfully networked, the third sampling calculator 161 transmits the operating parameters such as the power and the power consumption of the AC load 3000 to the upper computer 300 or the display terminal 20 through the third network device 162.

The third switch 163 is arranged between the AC input interface and the AC output interface, and includes at least one switch. A number of switches in the third switches 163 is the same as a number of the AC output interfaces. Each switch is provided between the AC input interface and one AC output interface. The third controller 164 is configured to control the on-off of the third switch 163 to control an on-off state of the AC load monitor 16. The power converter 167 is disposed between the third switch button 165 and the inverter 207 and configured to convert an alternating current output from the inverter 207 and then supply power to the third controller 164 in response to the third switch button 165 being on. The power supply end of the third controller 164 is connected to the inverter 207 through the third switch button 165. The inverter 207 is configured to supply power to the third controller 164 in response to the third switch button 165 being in the on state. After the user operates the third switch button 165, a path between the inverter 207 and the third controller 164 is disconnected, and the inverter 207 stops supplying power to the third controller 164. The third controller 164 is powered down, so the third switch 163 is switched off. The AC load monitor 16 further has overcurrent protection and leakage protection. In response to the output electrical signal of the inverter 207 and/or the input electrical signal of the AC load 3000 triggering the overcurrent protection and leakage protection, the third controller 164 controls the third switch 163 to be switched off to cut off the path between the inverter 207 and the AC load 3000. The user can also set a switching on-off state of the third switch 163 on the APP of the mobile phone. The APP of the mobile phone can transmit a control instruction to the AC load monitor 16 directly or through the display terminal, and the third controller 164 controls the third switch 163 based on the control instruction.

In another exemplary embodiment of the present disclosure, as shown in FIG. 10, the AC load monitor 16 further has a high voltage protection function. When the input voltage of the AC load monitor 16 is greater than a corresponding preset voltage threshold, the high voltage protection function is triggered to protect the AC load monitor 16 from breakdown by the high input voltage. The third display device 166 includes at least one fifth bi-color indicator light (not shown in the figure) and a sixth bi-color indicator light (not shown in the figure). A number of fifth bi-color indicator lights is the same as a number of AC output interfaces. For example, if five AC output interfaces are provided, five switches are provided in the third switches 163 and five fifth bi-color indicator lights are provided. Each fifth bi-color indicator lights indicates a switching on-off state of one switch in the third switches 163 and a current operating state of the AC load monitor 16. When the fifth bi-color indicator light is green, a corresponding switch in the third switches 163 is in the on state. When the fifth bi-color indicator light is red, the AC load monitor 16 is in a fault state. When the fifth bi-color indicator light is off, the AC load monitor 16 is in the off state. The sixth bi-color indicator light indicates the network connection state of the third network device 162. In the single-connection mode of the third network device 162, when the blue light is always on, the third network device 162 is successfully connected to the upper computer 300; and when the blue light flashes, the third network device 162 is not connected to the upper computer 300. In the wireless networking mode of the third network device 162, when the green light flashes rapidly, the third network device 162 is in the connection-to-access state; and when the green light is always on, the third network device 162 is successfully networked; and when the green light flashes slowly, the third network device 162 fails to find the display terminal 20.

Figure 11:
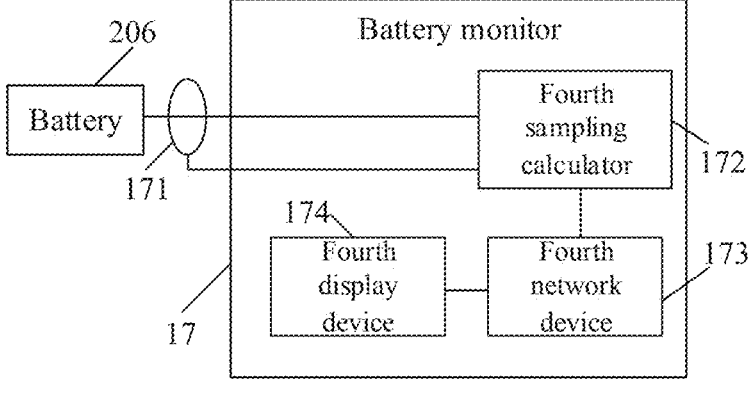
FIG. 11 is a schematic diagram showing a structure of a battery monitor according to an embodiment of the present disclosure.

In some embodiments, as shown in FIG. 11, the battery monitor 17 includes a battery input interface (not shown in the figure), a current sensor 171, a current detection interface (not shown in the figure), a fourth sampling calculator 172, a fourth network device 173, a fourth networking button, and a fourth display device 174. The battery input interface is adapted to connect the battery 206. The current sensor 171 is configured to sample an input current of the battery 206 and an output current of the battery 206. The current detection interface is connected to the current sensor 171. The fourth sampling calculator 172 is connected to the battery input interface and the current detection interface respectively, and configured to: sample a battery voltage of the battery 206 and determine the power, the residual capacity, the actual capacity, and the health state of the battery 206 based on the battery voltage, the input current, and the output current of the battery 206. The fourth network device 173 is connected to the fourth sampling calculator 172, supports a wireless networking mode, and configured to forward the power, the residual capacity, the actual capacity, and the health state of the battery 206 to the display terminal. The fourth network device 173 is further configured to enter a wireless networking mode in response to the fourth networking button being triggered. The fourth display device 174 is configured to display a network connection state of the fourth network device 173.

In an exemplary embodiment of the present disclosure, the battery input interface is adapted to connect to the battery 206 which supplies power to the battery monitor 17. The current sensor 171 (e.g., Hall sensor) is arranged around a bus of the battery 206 and is configured to sample the input current and the output current of the battery 206. The current sensor 171 has an output interface connected to a current monitoring interface and transmits the input current and the output current of the battery 206 to the fourth sampling calculator 172. The fourth sampling calculator 172 is further configured to sample the battery voltage of the battery 206 and determine the operating parameters of the battery 206, such as a charging power, a discharging power, the residual capacity, the actual capacity, and the health state of battery 206, based on the voltage, the input current, and the output current of the battery 206. By pressing and holding the fourth networking button, the fourth network device 173 is switched into a single-connection mode or a wireless networking mode. In the single connection mode, the battery monitor 17 directly performs a wireless communication with the upper computer 300, and directly transmits operating parameters of the battery 206, such as the charging power, the discharging power, the residual capacity, the actual capacity, and the health state of the battery, to the application program of the mobile phone. The application program of the mobile phone parses and displays the operating parameters of the battery 206, such as the charging power, the discharging power, the residual capacity, the actual capacity, and the health state of the battery. When the user performs a setting operation on the battery monitor 17 at the application program of the mobile phone, the application program of the mobile phone transmits a control instruction to the battery monitor 17, and the battery monitor 17 executes a corresponding operation in response to receiving the control instruction. In the wireless networking mode, the battery monitor 17 further has a connection-to-access state and a network access state. When the fourth network device 173 stores the network information of the display terminal 20, the fourth network device 173 enters the network access state and performs a wireless communication with the display terminal 20. When the battery monitor 17 needs to perform a wireless communication with other display terminals 20, the fourth networking button can be pressed to allow the fourth network device 173 to enter the connection-to-access state and then to perform wireless communication with other display terminals 20. Before successfully connecting to other display terminals 20, the battery monitor 17 can connect to the previous display terminal 20 at any time. After successfully connecting to other display terminals 20, the fourth network device 173 clears network information of a previous display terminal 20 and enters the network access state. When the fourth network device 173 does not store the network information of the display terminal 20, the fourth network device 173 enters the connection-to-access state, and then waits for the display terminal 20 to connect. The display terminal 20 and the fourth network device 173 exchange network information with each other. Before the fourth network device 173 is successfully connected to the display terminal 20, the fourth network device 173 cannot enter the network access state through operating the fourth networking button. After the fourth network device 173 is successfully networked, the fourth sampling calculator 172 transmits the power, the residual capacity, the actual capacity, and the health state of the battery 206 to the upper computer 300 or the display terminal 20 through the fourth network device 173. The fourth display device 174 changes based on the network connection state of the fourth network device 173 to prompt the user of the network connection state of the battery monitor 17.

In another exemplary embodiment of the present disclosure, the battery monitor 17 further has a high voltage protection function. When the voltage of the battery 206 is greater than a preset voltage threshold, the high voltage protection function is triggered to protect the battery monitor 17 from breakdown by a high input voltage. The fourth display device 174 is a seventh bi-color indicator light (not shown in the figure) which indicates the network connection state of the fourth network device 173. In the single-connection mode of the fourth network device 173, when the blue light is always on, the second network device 122 is successfully connected to the upper computer 300; and when the blue light flashes, the fourth network device 173 is not connected to the upper computer 300. In the wireless networking mode of the fourth network device 173, when the green light flashes rapidly, the fourth network device 173 is in the connection-to-access state; and when the green light is always on, the fourth network device 173 is successfully networked; and when the green light flashes slowly, the fourth network device 173 fails to find the display terminal 20.

To sum up, according to the monitoring apparatus for the energy storage system in the embodiments of the present disclosure, the monitor is configured to sample the output electrical signal of the energy storage device and obtain the operating parameter of the energy storage device based on the output electrical signal of the energy storage device. The monitor obtains the operating parameter of the energy storage device based on the output electrical signal of the energy storage device and does not depend on the operating parameter of the energy storage device itself. Therefore, the monitor can obtain the operating parameters of the corresponding energy storage device of any brand. The monitor supports the wireless networking mode. The monitor is in wireless communication with the display terminal, and transmits the operating parameters of the energy storage device to the upper computer through the display terminal, realizing the data integration of the plurality of energy storage devices. In this way, the users do not have to switch application programs frequently, thereby saving their time.

Corresponding to the above embodiments, an energy storage system is further provided by the embodiments of the present disclosure. As shown in FIG. 1, an energy storage system 1000 includes the monitoring apparatus for the energy storage system 100 according to any of the above-mentioned embodiments.

According to the energy storage system of the embodiments of the present disclosure, by adopting the above-mentioned monitoring apparatus, the monitor is configured to sample the output electrical signal of the energy storage device, and obtain the operating parameter of the energy storage device based on the output electrical signal of the energy storage device. Therefore, the monitor can obtain the operating parameter of the corresponding energy storage device of any brand. The monitor is further configured to transmit the operating parameter of the energy storage device to the upper computer through the display terminal, realizing the data integration of the plurality of energy storage devices. In this way, the users do not have to switch application programs frequently, thereby saving their time.

In the description of this specification, description with reference to the terms "an embodiment", "some embodiments", "exemplary embodiments", "examples" "specific examples", or "some examples" etc., mean that specific features, structure, materials or characteristics described in conjunction with the embodiment or example are included in at least one embodiment or example of the present disclosure. In this specification, the schematic representations of the above terms do not necessarily refer to the same embodiment or example. Moreover, the described specific features, structures, materials or characteristics may be combined in any one or more embodiments or examples in a suitable manner.

In addition, terms "first", "second" and the like that are used in the embodiments of the present disclosure are only used for descriptive purposes, and cannot be understood as indicating or implying relative importance or implicitly indicating the number of the indicated technical features. Therefore, the features associated with "first" and "second" may explicitly or implicitly include at least one of the features. In the description of the present disclosure, "plurality" means at least two or more, such as two, three, four, etc., unless otherwise specifically defined.

In the present disclosure, unless otherwise clearly specified and limited, terms such as "install", "connect", "connect to", "fix" and the like should be understood in a broad sense. For example, it may be a fixed connection or a detachable connection or connection as one piece; mechanical connection or electrical connection; direct connection or indirect connection through an intermediate; internal communication of two components or the interaction relationship between two components. For those skilled in the art, the specific meaning of the above-mentioned terms in the present disclosure can be understood according to specific circumstances.

Although embodiments of the present disclosure have been shown and described above, it should be understood that the above embodiments are merely exemplary, and cannot be construed as limitations of the present disclosure. For those skilled in the art, changes, alternatives, variants and modifications can be made to the above embodiments without departing from the scope of the present disclosure.

What is claimed is:

1. A monitoring apparatus for an energy storage system, comprising:

a plurality of monitors, each of the plurality of monitors being configured to sample an input electrical signal and/or an output electrical signal of one energy storage device and determine an operating parameter of the corresponding energy storage device based on the input electrical signal and/or the output electrical signal, and each of the plurality of monitors supporting a wireless networking mode; and a display terminal configured to perform a wireless communication with an upper computer, and transmit the operating parameter of the corresponding energy storage device to the upper computer by performing a wireless communication with each of the plurality of monitors when each of the plurality of monitors operates in the wireless networking mode, to allow the upper computer to display the operating parameter of the corresponding energy storage device, wherein each of a plurality of energy storage devices comprises a photovoltaic module, a solar charging controller, a battery, and an inverter, and each of the plurality of monitors comprises:

a photovoltaic monitor arranged between the photovoltaic module and the solar charging controller, and configured to: sample an output electrical signal of the photovoltaic module and an input electrical signal of the solar charging controller, determine a current value, a voltage value, a power, and power generation of the photovoltaic module based on the output electrical signal of the photovoltaic module and the input electrical signal of the solar charging controller, and perform an on-off control on a circuit between the photovoltaic module and the solar charging controller;

a direct current (DC) load monitor arranged between a DC source and a DC load of the energy storage system, and configured to: sample an output electrical signal of the DC source and an input electrical signal of the DC load, determine a power and power consumption of the DC load based on the output electrical signal of the DC source and the input electrical signal of the DC load, perform an on-off control on a circuit between the DC source and the DC load, and perform overcurrent protection based on the output electrical signal of the DC source and the input electrical signal of the DC load;

an alternating current (AC) load monitor arranged between the inverter and an AC load of the energy storage system, and configured to: sample an output electrical signal of the inverter and an input electrical signal of the AC load, determine a power and power consumption of the AC load based on the output electrical signal of the inverter and the input electrical signal of the AC load, perform an on-off control of a circuit between the inverter and the AC load, and perform overcurrent protection and leakage protection based on the output electrical signal of the inverter and the input electrical signal of the AC load; and a battery monitor adapted to be connected to the battery, and configured to: sample an input electrical signal of the battery and an output electrical signal of the battery, and determine a power, a residual capacity, an actual capacity, and a health state of the battery based on the input electrical signal of the battery and the output electrical signal of the battery.

2. The monitoring apparatus according to claim 1, wherein each of the plurality of monitors is further configured to perform a wireless communication with the upper computer to transmit the operating parameter of the corresponding energy storage device to the upper computer.

3. The monitoring apparatus according to claim 2, wherein each of the plurality of monitors is further configured to disconnect from the upper computer when the display terminal performs a wireless communication with the monitor.

4. The monitoring apparatus according to claim 1, further comprising a networking relay arranged between the plurality of monitors and the display terminal and configured to forward the operating parameters in the plurality of monitors to the display terminal.

5. The monitoring apparatus according to claim 1, wherein the photovoltaic monitor comprises:

a photovoltaic input interface adapted to be connected to the photovoltaic module;

a photovoltaic output interface adapted to be connected to the solar charging controller;

a first sampling calculator connected to the photovoltaic input interface and the photovoltaic output interface respectively, and configured to: sample the output electrical signal of the photovoltaic module and the input electrical signal of the solar charging controller, and determine the current value, the voltage value, the power, and the power generation of the photovoltaic module based on the output electrical signal of the photovoltaic module and the input electrical signal of the solar charging controller;

a first network device connected to the first sampling calculator, supporting a wireless networking mode, and configured to transmit the current value, the voltage value, the power, and the power generation of the photovoltaic module to the display terminal;

a first networking button, the first network device further configured to enter a wireless networking mode in response to the first networking button being triggered;

a first switch arranged between the photovoltaic input interface and the photovoltaic output interface;

a first controller and a first switch button, the first controller having a power supply end connected to the photovoltaic module through the first switch button, and the first controller being connected to the first sampling calculator and configured to: control the first switch to be switched off in response to the output electrical signal of the photovoltaic module and/or the input electrical signal of the solar charging controller triggering protection; and a first display device connected to the first network device and the first controller respectively and configured to display a current operating state, a switching on-off state of the first switch, and a network connection state of the first network device.

6. The monitoring apparatus according to claim 1, wherein the DC load monitor comprises:

a DC input interface adapted to be connected to the DC source;

at least one DC output interface, each of the at least one DC output interface adapted to be connected to one DC load;

a second sampling calculator connected to the DC input interface and the at least one DC output interface respectively, and configured to: sample the output electrical signal of the DC source and the input electrical signal of the DC load, and determine the power and the power consumption of the DC load based on the output electrical signal of the DC source and the input electrical signal of the DC load;

a second network device connected to the second sampling calculator, supporting a wireless networking mode, and configured to transmit the power and the power consumption of the DC load to the display terminal;

a second networking button, the second network device further configured to enter a wireless networking mode in response to the second networking button being triggered;

a second switch arranged between the DC input interface and the at least one DC output interface;

a second controller and a second switch button, the second controller having a power supply end connected to the DC source through the second switch button, and the second controller being connected to the second sampling calculator and configured to control the second switch to be switched off in response to a determination of an overcurrent output based on the output electrical signal of the DC source and the input electrical signal of the DC load; and a second display device connected to the second network device and the second controller respectively, and configured to display a switching on-off state of the second switch and a network connection state of the second network device.

7. The monitoring apparatus according to claim 1, wherein the AC load monitor comprises:

an AC input interface adapted to be connected to the inverter;

at least one AC output interface, each of the at least one AC output interface adapted to be connected to one AC load;

a third sampling calculator connected to the AC input interface and the at least one AC output interface respectively, and configured to: sample the output electrical signal of the inverter and the input electrical signal of the AC load, and determine the power and the power consumption of the AC load based on the output electrical signal of the inverter and the input electrical signal of the AC load;

a third network device connected to the third sampling calculator, supporting a wireless networking mode, and configured to transmit the power and the power consumption of the AC load to the display terminal;

a third networking button, the third network device further configured to enter a wireless networking mode in response to the third networking button being triggered;

a third switch arranged between the AC input interface and the at least one AC output interface;

a power converter adapted to be connected to the inverter and configured to convert an alternating current generated by the inverter to generate a direct current;

a third controller and a third switch button, the third controller having a power supply end connected to the power converter through the third switch button, and the third controller being connected to the third sampling calculator and configured to control the third switch to be switched off in response to a determination of an overcurrent output or an existence of leakage based on the output electrical signal of the inverter and the input electrical signal of the AC load; and a third display device connected to the third network device and the third controller respectively, and configured to display a switching on-off state of the third switch and a network connection state of the third network device.

8. The monitoring apparatus according to claim 1, wherein the battery monitor comprises:

a battery input interface adapted to connect the battery;

a current sensor configured to sample an input current of the battery and an output current of the battery;

a current detection interface connected to the current sensor;

a fourth sampling calculator connected to the battery input interface and the current detection interface respectively, and configured to: sample a battery voltage and determine the power, the residual capacity, the actual capacity, and the health state of the battery based on the battery voltage, the input current, and the output current of the battery;

a fourth network device connected to the fourth sampling calculator, supporting a wireless networking mode, and configured to forward the power, the residual capacity, the actual capacity, and the health state of the battery to the display terminal;

a fourth networking button, the fourth network device further configured to enter a wireless networking mode in response to the fourth networking button being triggered; and a fourth display device connected to the fourth network device and configured to display a network connection state of the fourth network device.

9. An energy storage system, comprising a monitoring apparatus for the energy storage system, wherein the monitoring apparatus comprises:

a plurality of monitors, each of the plurality of monitors being configured to sample an input electrical signal and/or an output electrical signal of one energy storage device and determine an operating parameter of the corresponding energy storage device based on the input electrical signal and/or the output electrical signal, and each of the plurality of monitors supporting a wireless networking mode; and a display terminal configured to perform a wireless communication with an upper computer, and transmit the operating parameter of the corresponding energy storage device to the upper computer by performing a wireless communication with each of the plurality of monitors when each of the plurality of monitors operates in the wireless networking mode, to allow the upper computer to display the operating parameter of the corresponding energy storage device, wherein each of a plurality of energy storage devices comprises a photovoltaic module, a solar charging controller, a battery, and an inverter, and each of the plurality of monitors comprises:

a photovoltaic monitor arranged between the photovoltaic module and the solar charging controller, and configured to: sample an output electrical signal of the photovoltaic module and an input electrical signal of the solar charging controller, determine a current value, a voltage value, a power, and power generation of the photovoltaic module based on the output electrical signal of the photovoltaic module and the input electrical signal of the solar charging controller, and perform an on-off control on a circuit between the photovoltaic module and the solar charging controller;

a direct current (DC) load monitor arranged between a DC source and a DC load of the energy storage system, and configured to: sample an output electrical signal of the DC source and an input electrical signal of the DC load, determine a power and power consumption of the DC load based on the output electrical signal of the DC source and the input electrical signal of the DC load, perform an on-off control on a circuit between the DC source and the DC load, and perform overcurrent protection based on the output electrical signal of the DC source and the input electrical signal of the DC load;

an alternating current (AC) load monitor arranged between the inverter and an AC load of the energy storage system, and configured to: sample an output electrical signal of the inverter and an input electrical signal of the AC load, determine a power and power consumption of the AC load based on the output electrical signal of the inverter and the input electrical signal of the AC load, perform an on-off control of a circuit between the inverter and the AC load, and perform overcurrent protection and leakage protection based on the output electrical signal of the inverter and the input electrical signal of the AC load; and a battery monitor adapted to be connected to the battery, and configured to: sample an input electrical signal of the battery and an output electrical signal of the battery, and determine a power, a residual capacity, an actual capacity, and a health state of the battery based on the input electrical signal of the battery and the output electrical signal of the battery.

10. The energy storage system according to claim 9, wherein each of the plurality of monitors is further configured to perform a wireless communication with the upper computer to transmit the operating parameter of the corresponding energy storage device to the upper computer.

11. The energy storage system according to claim 10, wherein each of the plurality of monitors is further configured to disconnect from the upper computer when the display terminal performs a wireless communication with the monitor.

12. The energy storage system according to claim 9, wherein the monitoring apparatus further comprises a networking relay arranged between the plurality of monitors and the display terminal and configured to forward operating parameters in the plurality of monitors to the display terminal.

13. The energy storage system according to claim 9, wherein the photovoltaic monitor comprises:

a photovoltaic input interface adapted to be connected to the photovoltaic module;

a photovoltaic output interface adapted to be connected to the solar charging controller;

a first sampling calculator connected to the photovoltaic input interface and the photovoltaic output interface respectively, and configured to: sample the output electrical signal of the photovoltaic module and the input electrical signal of the solar charging controller, and determine the current value, the voltage value, the power, and the power generation of the photovoltaic module based on the output electrical signal of the photovoltaic module and the input electrical signal of the solar charging controller;

a first network device connected to the first sampling calculator, supporting a wireless networking mode, and configured to transmit the current value, the voltage value, the power, and the power generation of the photovoltaic module to the display terminal;

a first networking button, the first network device further configured to enter a wireless networking mode in response to the first networking button being triggered;

a first switch arranged between the photovoltaic input interface and the photovoltaic output interface;

a first controller and a first switch button, the first controller having a power supply end connected to the photovoltaic module through the first switch button, and the first controller being connected to the first sampling calculator and configured to: control the first switch to be switched off in response to the output electrical signal of the photovoltaic module and/or the input electrical signal of the solar charging controller triggering protection; and a first display device connected to the first network device and the first controller respectively and configured to display a current operating state, a switching on-off state of the first switch, and a network connection state of the first network device.

14. The energy storage system according to claim 9, wherein the DC load monitor comprises:

a DC input interface adapted to be connected to the DC source;

at least one DC output interface, each of the at least one DC output interface adapted to be connected to one DC load;

a second sampling calculator connected to the DC input interface and the at least one DC output interface respectively, and configured to: sample the output electrical signal of the DC source and the input electrical signal of the DC load, and determine the power and the power consumption of the DC load based on the output electrical signal of the DC source and the input electrical signal of the DC load;

a second network device connected to the second sampling calculator, supporting a wireless networking mode, and configured to transmit the power and the power consumption of the DC load to the display terminal;

a second networking button, the second network device further configured to enter a wireless networking mode in response to the second networking button being triggered;

a second switch arranged between the DC input interface and the at least one DC output interface;

a second controller and a second switch button, the second controller having a power supply end connected to the DC source through the second switch button, and the second controller being connected to the second sampling calculator and configured to control the second switch to be switched off in response to a determination of an overcurrent output based on the output electrical signal of the DC source and the input electrical signal of the DC load; and a second display device connected to the second network device and the second controller respectively, and configured to display a switching on-off state of the second switch and a network connection state of the second network device.

15. The energy storage system according to claim 9, wherein the AC load monitor comprises:

an AC input interface adapted to be connected to the inverter;

at least one AC output interface, each of the at least one AC output interface adapted to be connected to one AC load;

a third sampling calculator connected to the AC input interface and the at least one AC output interface respectively, and configured to: sample the output electrical signal of the inverter and the input electrical signal of the AC load, and determine the power and the power consumption of the AC load based on the output electrical signal of the inverter and the input electrical signal of the AC load;

a third network device connected to the third sampling calculator, supporting a wireless networking mode, and configured to transmit the power and the power consumption of the AC load to the display terminal;

a third networking button, the third network device further configured to enter a wireless networking mode in response to the third networking button being triggered;

a third switch arranged between the AC input interface and the at least one AC output interface;

a power converter adapted to be connected to the inverter and configured to convert an alternating current generated by the inverter to generate a direct current;

a third controller and a third switch button, the third controller having a power supply end connected to the power converter through the third switch button, and the third controller being connected to the third sampling calculator and configured to control the third switch to be switched off in response to a determination of an overcurrent output or an existence of leakage based on the output electrical signal of the inverter and the input electrical signal of the AC load; and a third display device connected to the third network device and the third controller respectively, and configured to display a switching on-off state of the third switch and a network connection state of the third network device.

16. The energy storage system according to claim 9, wherein the battery monitor comprises:

a battery input interface adapted to connect the battery;

a current sensor configured to sample an input current of the battery and an output current of the battery;

a current detection interface connected to the current sensor;

a fourth sampling calculator connected to the battery input interface and the current detection interface respectively, and configured to: sample a battery voltage and determine the power, the residual capacity, the actual capacity, and the health state of the battery based on the battery voltage, the input current, and the output current of the battery;

a fourth network device connected to the fourth sampling calculator, supporting a wireless networking mode, and configured to forward the power, the residual capacity, the actual capacity, and the health state of the battery to the display terminal;

a fourth networking button, the fourth network device further configured to enter a wireless networking mode in response to the fourth networking button being triggered; and a fourth display device connected to the fourth network device and configured to display a network connection state of the fourth network device.

* * * * *